(12) United States Patent
Jafarkhani et al.

(10) Patent No.: US 10,187,088 B2
(45) Date of Patent: Jan. 22, 2019

(54) COST-EFFICIENT REPAIR FOR STORAGE SYSTEMS USING PROGRESSIVE ENGAGEMENT

(71) Applicant: The Regents of the University of California, Oakland, CA (US)

(72) Inventors: Hamid Jafarkhani, Irvine, CA (US); Mahdi Hajiaghayi, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 67 days.

(21) Appl. No.: 14/689,870

(22) Filed: Apr. 17, 2015

(65) Prior Publication Data

US 2015/0303949 A1    Oct. 22, 2015

Related U.S. Application Data

(60) Provisional application No. 61/982,055, filed on Apr. 21, 2014.

(51) Int. Cl.
| | | |
|---|---|---|
| *H03M 13/00* | (2006.01) | |
| *H04L 29/08* | (2006.01) | |
| *G06F 11/10* | (2006.01) | |
| *G06F 11/34* | (2006.01) | |
| *H03M 13/03* | (2006.01) | |
| *H03M 13/13* | (2006.01) | |
| *H03M 13/37* | (2006.01) | |

(52) U.S. Cl.
CPC ....... *H03M 13/617* (2013.01); *G06F 11/1076* (2013.01); *G06F 11/1092* (2013.01); *G06F 11/3447* (2013.01); *H03M 13/036* (2013.01); *H03M 13/13* (2013.01); *H03M 13/373* (2013.01); *H03M 13/616* (2013.01)

(58) Field of Classification Search
CPC .. H03M 13/036; H03M 13/373; H03M 13/13; H03M 13/616; H03M 13/617; G06F 11/3447; G06F 11/1076; H04L 67/1097
See application file for complete search history.

(56) References Cited

U.S. PATENT DOCUMENTS

| | | | | |
|---|---|---|---|---|
| 2011/0289351 A1* | 11/2011 | Rashmi | ............... | G06F 11/1662 714/6.32 |
| 2012/0173932 A1* | 7/2012 | Li | ............... | G06F 11/1076 714/42 |
| 2012/0266044 A1* | 10/2012 | Hu | ............... | G06F 11/1092 714/763 |

(Continued)

*Primary Examiner* — Kyle Vallecillo
(74) *Attorney, Agent, or Firm* — Daniel L. Dawes; Marcus C. Dawes (57) ABSTRACT

An apparatus or method for minimizing the total accessing cost, such as minimizing repair bandwidth, delay or the number of hops including the steps of minimizing the number of nodes to be engaged for the recovery process using a polynomial-time solution that determines the optimal number of participating nodes and the optimal set of nodes to be engaged for recovering lost data, where in a distributed database storage system, for example a dynamic system, where the accessing cost or even the number of available nodes are subject to change results in different values for the optimal number of participating nodes. An MDS code is included which can be reused when the number of participating nodes varies without having to change the entire code structure and the content of the nodes.

13 Claims, 4 Drawing Sheets

(56) References Cited

U.S. PATENT DOCUMENTS

| | | | | |
|---|---|---|---|---|
| 2015/0142863 A1* | 5/2015 | Yuen | .................... | H03M 13/13 707/827 |
| 2015/0358037 A1* | 12/2015 | Li | ...................... | G06F 11/1088 714/763 |
| 2016/0006463 A1* | 1/2016 | Li | .................... | H03M 13/1515 714/766 |

* cited by examiner

| S-node 1 | S-node 2 | S-node 3 | P-node 1 | P-node 2 |
|---|---|---|---|---|
| $a(0)$ | $b(0)$ | $c(0)$ | $a(0) + b(0) + c(0)$ | $\lambda_1 a(0) + \lambda_2 b(1) + \lambda_3 c(2)$ |
| $a(1)$ | $b(1)$ | $c(1)$ | $a(1) + b(1) + c(1)$ | $\lambda_1 a(1) + \lambda_2 b(2) + \lambda_3 c(3)$ |
| $a(2)$ | $b(2)$ | $c(2)$ | $a(2) + b(2) + c(2)$ | $\lambda_1 a(2) + \lambda_2 b(3) + \lambda_3 c(0)$ |
| $a(3)$ | $b(3)$ | $c(3)$ | $a(3) + b(3) + c(3)$ | $\lambda_1 a(3) + \lambda_2 b(0) + \lambda_3 c(1)$ |

*FIG. 1*

| S-node 1 | S-node 2 | S-node 3 | P-node 1 | P-node 2 |
|---|---|---|---|---|
| $a(0)$ | $b(0)$ | $c(0)$ | $a(0) + b(0) + c(0)$ | $\lambda_1 a(0) + \lambda_2 b(1) + \lambda_3 c(2)$ |
| $a(1)$ | $b(1)$ | $c(1)$ | $a(1) + b(1) + c(1)$ | $\lambda_1 a(1) + \lambda_2 b(2) + \lambda_3 c(3)$ |
| $a(2)$ | $b(2)$ | $c(2)$ | $a(2) + b(2) + c(2)$ | $\lambda_1 a(2) + \lambda_2 b(3) + \lambda_3 c(0)$ |
| $a(3)$ | $b(3)$ | $c(3)$ | $a(3) + b(3) + c(3)$ | $\lambda_1 a(3) + \lambda_2 b(0) + \lambda_3 c(1)$ |

*FIG. 2*

| P-node 3 |
|---|
| $\lambda_1^2 a(0) + \lambda_2^2 b(3) + \lambda_3^2 c(2)$ |
| $\lambda_1^2 a(1) + \lambda_2^2 b(0) + \lambda_3^2 c(3)$ |
| $\lambda_1^2 a(2) + \lambda_2^2 b(1) + \lambda_3^2 c(0)$ |
| $\lambda_1^2 a(3) + \lambda_2^2 b(2) + \lambda_3^2 c(1)$ |

COST-EFFICIENT REPAIR FOR STORAGE SYSTEMS USING PROGRESSIVE ENGAGEMENT

RELATED APPLICATIONS

This application is related pursuant to 35 USC 119 to U.S. provisional patent application Ser. No. 61/982,055, filed on Apr. 21, 2014, incorporated herein by reference.

BACKGROUND

Field of the Technology

The disclosure relates to the field of maximum distance separable (MDS) erasure codes that provide efficient failure recovery solution in a distributed storage system used in massive computing networks.

Description of the Prior Art

Cloud storage is a model of networked enterprise storage where data is stored in virtualized pools of storage which are generally hosted by third parties. Hosting companies operate large data centers, and people who require their data to be hosted buy or lease storage capacity from them. The data center operators, in the background, virtualize the resources according to the requirements of the customer and expose them as storage pools, which the customers can themselves use to store files or data objects. Physically, the resource may span across multiple servers and multiple locations. The safety of the files depends upon the hosting companies, and on the applications that leverage the cloud storage. Each storage location or source could be called a node in the cloud.

In information theory, an erasure code is a forward error correction (FEC) code for the binary erasure channel, which transforms a message of k symbols into a longer message (code word) with n symbols such that the original message can be recovered from a subset of the n symbols. Optimal erasure codes have the property that any k out of the n code word symbols are sufficient to recover the original message (i.e., they have optimal reception efficiency). Optimal erasure codes are maximum distance separable codes (MDS codes). Optimal codes are often costly (in terms of memory usage, CPU time, or both) when n is large.

Consider a simplified example. In the simple case where k=2, redundancy symbols may be created by sampling different points along the line between the two original symbols. This is pictured with a simple example, called err-mail: Alice wants to send her telephone number (555629) to Bob using err-mail. Err-mail works just like e-mail, except: About half of all the mail gets lost. Messages longer than 5 characters are illegal. It is very expensive (similar to air-mail). Instead of asking Bob to acknowledge the messages she sends, Alice devises the following scheme. She breaks her telephone number up into two parts a=555, b=629, and sends 2 messages—"A555" and "B=629"—to Bob. She constructs a linear function, $f(i)=a+(b-a)(i-1)$, in the case $f(i)=555+74(i-1)$, such that $f(1)=555$ and $f(2)=629$. She computes the values f(3), f(4), and f(5), and then transmits three redundant messages: "C=703", "D=777" and "E=851". Bob knows that the form of f(k) is $f(i)=a+(b-a)(i-1)$, where a and b are the two parts of the tele phone number. Now suppose Bob receives "D=777" and "E=851". Bob can reconstruct Alice's phone number by computing the values of a and b from the values (f(4) and f(5)) he has received. Bob can perform this procedure using, any two err-mails, so the erasure code in this example has a rate of 40%. Note that Alice cannot encode her telephone number in just one err-mail, because it contains six characters, and the maximum length of one err-mail message is five characters. If she sent her phone number in pieces, asking Bob to acknowledge receipt of each piece, at least four messages would have to be sent anyway (two from Alice, and two acknowledgments from Bob). So the erasure code in this example, which requires five messages, is quite economical.

With the advent of the cloud storage systems, ordinary users and enterprises are increasingly moving their data to the cloud in order to have higher reliability, availability, and accessibility. These massive data are distributed across a large number of storage nodes via cloud file system and preserved for long time, perhaps forever. Due to various incidents, ranging from regional disasters such as earthquake, to hardware/software update on storage nodes, the cloud file system must be able to reconstruct the user data only from a subset of storage nodes. Such capability can be obtained through an efficient fault-tolerant system based on replication and redundancy.

Mirroring is a basic yet popular solution and local storage systems usually adopt it. This solution simply keeps an exact copy of the data in multiple, usually three, storage nodes. Mirroring results in high availability but it comes at the price of high redundancy. While mirroring may work for a local storage system, its hardware and operation cost (power, cooling systems and maintenance) drastically increases with the size of data, thus not efficient for a cloud systems. Therefore, cloud file systems are transitioning to adopt erasure codes, e.g. Windows Azure Storage and google GFS. Erasure codes provide high failure tolerance with much lower redundancy leading to a more energy-efficient and green storage systems.

Mirroring is a popular technique that has been widely adopted by distributed storage systems. This method is also reflected in levels 1-2 of Redundant Array of Inexpensive Disk (RAID). To reduce the abundant redundancy of mirroring, erasure codes are recently used for storage systems as an alternative to replication and mirroring traditionally in communication systems, and more recently in storage systems. An (n, k) erasure code can tolerate up to (n−k) node failures without data loss with much lower redundancy compared with mirroring. MDS codes as a subclass of erasure codes store the same size of data, M/k, in each node, where M is size of the data to be stored. A Reed-Solomon code is a famous example of MDS codes, a matrix that is either a Vandermonde or Cauchy matrix. Other codes such as low-density parity-check (LDPC) and its families including LT codes and Raptor codes have also been considered for distributed storage systems. It is shown that while these codes exhibit a considerably low decoding complexity due to their XOR-based structure, the MDS property fails to hold in a deterministic sense. To address this problem, there have been prior attempts to find some XOR-based MDS codes using an exhaustive search approach over all possible cases. Due to the exponential growing search space, they could only provide such codes for limited cases (k<20, and (n−k) <10). For a given XOR-based erasure code, an algorithm has been proposed that finds the minimum number of nodes needed for recovering data from multiple node failures. However, the MDS property cannot be maintained. Others have explored the design space between these two limits to find a better trade-off between redundancy and repair-bandwidth. They propose a set of codes called Hierarchical Codes which allows for single failure recovery with repair bandwidth less than a total M. Some have aimed at minimizing the number of nodes to be contacted for recovery while offering the MDS property for the codes with rate less than ½. When a node fails, to keep the data integrity, the lost data must be recovered and loaded to a new node. This repairing or recovering process can be either functional or exact. The former allows the generated information in the new node to be different from the failed piece (as long as the MDS property prevails), while the latter requires the lost information piece to be reconstructed exactly.

Among erasure codes, maximum distance separable (MDS) codes are optimal in terms of redundancy-reliability trade-off. An (n, k) MDS code stores Mk of data with size M in each node and can reconstruct the whole data from any k nodes out of the total n nodes. Several MDS codes such as Reed-Solomon, row-diagonal parity (RDP), EVENODD, X-code, and WEAVER codes were proposed in the literature, each with specific features and decoding complexity to protect data against multiple disk failures. When a permanent failure occurs, the lost data must be recovered and regenerated at a new node to maintain the data integrity. In case of temporary failure (e.g. OS upgrade or rebooting), if there is an on-demand read from a user to the data of the failed node, the lost data must be dynamically reconstructed from the other nodes to address the user's request.

The problem of storing massive amounts of information over storage disks (nodes) has been always significant and challenging. The illustrated embodiments propose a coding technique to store the data across storage nodes that allows flexibility in choosing any subset or a variable number of storage nodes to recover the data while reducing the amount of data that must be transferred.

As an alternative to the inefficient mirroring technique, erasure codes provide high failure tolerance with much lower redundancy. Among erasure codes, MDS codes are optimal in terms of redundancy-reliability trade-off. An (n, k) MDS code stores M/k of data with size M in each node and can reconstruct the whole data from any k nodes out of the total n nodes. When a failure occurs in storage nodes, the lost data must be recovered and regenerated at a new node to maintain the data integrity. The amount of data that must be downloaded from d surviving nodes to repair a single failure is called repair bandwidth. The downside of the traditional MDS codes is that the entire data must be downloaded before recovering the lost data. Hence, its repair bandwidth is M, albeit to only M/k portion of the original data being lost in a failed node.

A class of MDS codes has been proposed to achieve minimum repair bandwidth. It turned out that there is a tradeoff between the number of participating nodes and the repair bandwidth so that the minimum possible repair bandwidth is achieved when all the surviving nodes are engaged. However, engaging and accessing all nodes can be too costly, if not infeasible, for many geographically-distributed storage systems. Moreover, none of the existing MDS codes provide flexibility in choosing the number of participating nodes without changing the code structure and the content of the nodes. In other words, for these codes, the number of participating nodes as well as the total number of nodes must be known when designing codes and launching the cloud storage systems. This information may not be provided for many dynamic storage systems where the number of available nodes is subject to change or the cost of accessing them can be too high.

Therefore, what is needed is an MDS code that, in addition to minimizing repair bandwidth, can be reused when the number of participating nodes varies without having to change the entire code structure and content of the existing nodes in the cloud, and at the same time, reduce the repair bandwidth by engaging more nodes. This requirement calls for a new class of MDS codes with a new property that is called in this specification, "progressive engagement".

What is needed is a new objective that in addition to minimizing the repair bandwidth simultaneously attempts to minimize the total accessing cost, which can be due to the delay or the number of hops to reach the nodes or any other parameter of the cloud communication or systems.

BRIEF SUMMARY

Fast and efficient failure recovery is a new challenge for cloud storage systems with a large number of storage nodes. We address the following fundamental question: Upon the failure of a single storage node, how many and which surviving storage nodes must participate in the recovery process of regenerating the lost data? We linearly combine two cost metrics to construct the total cost function. The first cost metric is accessing cost that encompasses the cost associated with accessing the selected nodes in terms of delay or the number of hops to reach them. The second cost metric is repair bandwidth cost which refers to the amount of data and traffic that must be downloaded from the selected surviving nodes for regenerating the lost data. Our objective is to select an optimal set of surviving nodes that incurs minimum total cost during the recovery. The existing prior art maximum distance separable (MDS) codes cannot cope with this objective in a dynamic cloud system as their design has been based on one of the two cost metrics.

Hence to accommodate our proposed solution, we introduce a new class of MDS codes with a property called the progressive engagement. This property provides flexibility in engaging more surviving nodes n favor of reducing the repair bandwidth without redesigning the code structure and changing the content of the existing nodes. An example of such codes based on the permutation code is provided. (MDS) coding solutions that can accommodate our scheme and basically provide flexibility in choosing surviving nodes without redesigning the code structure and changing the content of the existing nodes.

We also present a search algorithm to find a new set of codes named rotation codes that satisfy the progressive engagement conditions. Furthermore, we illustrate how the existing permutation codes can provide progressive engagement by modifying the original recovery scheme. Simulation results are presented to compare the repair bandwidth and total cost performance of such codes as well as their speed of single failure recovery.

We finally present a practical scheme called progressive engagement resembling the progressive transmission in the wireless communication context. This scheme gradually adds and engages storages nodes for recovery until the minimum desired cost is reached.

In summary, the illustrated embodiments of the invention include a method for data failure recovery of a node in a storage system or distributed database with minimal cost. The method includes the steps of linearly combining at least two cost metrics to construct a total cost function, and selecting an optimal set of surviving nodes that incurs a minimum total cost during data recovery. Although the main application is cloud systems, the approach works for any distributed database, note that the storage nodes don't have to be in different parts of the internet network or cloud. For example, they may be in different memory locations or hard-drives of single computer, local network of computers or database.

The two cost metrics include accessing cost associated with accessing selected surviving storage nodes in terms of delay or the number of hops to reach the selected nodes, and repair bandwidth cost associated with the amount of data and traffic downloaded from the selected surviving storage nodes for regenerating lost data.

The step of selecting an optimal set of surviving nodes that incurs a minimum total cost during data recovery includes minimizing the number of storage nodes to be engaged for the recovery process using a polynomial-time solution and determining from the solution the optimal number of participating surviving storage nodes and the optimal set of surviving nodes engaged for recovering lost data.

The step of determining from the solution the optimal number of participating surviving storage nodes and the optimal set of surviving nodes engaged for recovering lost data uses an MDS code that has a progressive engagement property defined as 1) providing flexibility in engaging any number of surviving nodes, without redesigning the code structure and changing the content of other nodes, and 2) reducing repair bandwidth by engaging more surviving nodes.

The step of determining from the solution the optimal number of participating surviving storage nodes and the optimal set of surviving nodes engaged for recovering lost data includes determining the solution of the integer equation $$\min_{\alpha_1,\ldots,\alpha_m} \omega_1 \sum_{i=1}^{m} \alpha_i c_{1i} + \omega_2 \gamma \left( \sum_{i=1}^{m} \alpha_i \right)$$

$$\text{s.t. } I) \sum_{i=1}^{m} \alpha_i \geq 1$$

$$II) \alpha_i \in \{0, 1\}, \quad i = 1, \ldots, m,$$

by finding p* nodes from the parity set of P-nodes, 1 . . . m that minimize a weighted sum of the repair bandwidth and the accessing cost, defining a binary indicator $\alpha_j$ included in the set $\{0, 1\}$, for every i=1, . . . , m such that $c_j$ is 1 if P-node i is selected, and 0 otherwise, where accessing cost is represented by the cost matrix $C=\{c_{ij}\}_{m \times n}$, where $c_{ij}$ denotes the cost associated with contacting and accessing node j for recovering the data of node i, where repair bandwidth cost is denoted by $\gamma(p)$ for a given coding scheme, and where $\omega_1$, and $\omega_2$ are the respective weights to accessing cost and repair bandwidth costs normalized to $\omega_1+\omega_2=1$.

The step of determining the solution of the integer equation includes letting $$\Sigma_{i=1}^m \alpha_i = p$$

for any given p, the optimization variables are obtained from $$A(p) = \min_{\alpha_1,\ldots,\alpha_m} \omega_1 \sum_{i=1}^{m} \alpha_i c_{1i}$$

-continued $$\text{s.t. } I) \sum_{i=1}^{m} \alpha_i = p$$

$$II) \alpha_i \in \{0, 1\}, \quad i = 1, \ldots, m,$$

with the solution $$\alpha_i(p)^* = \begin{cases} 1, & \text{if } i \in \text{argmin}_p(c_1, \ldots, c_m) \\ 0, & \text{otherwise} \end{cases}.$$

where arg $\min_p(c_1, \ldots, c_m)$ returns an index set of the first p the smallest of $c_1, \ldots, c_m$.

The step of determining the solution of the integer equation includes sorting the accessing costs $c_1, \ldots, c_m$ once using a quicksort algorithm and returning an index of a first p elements with p having only integer values from 1 to m, the solution is obtained by iterating over p=1, . . . , m and finding p that achieves minimum $A(p)+w_2\gamma(p)$ with a corresponding $\alpha_i(p^*)^*$ determining whether parity node i is in the optimal selection set or not.

The step of determining from the solution the optimal number of participating surviving storage nodes and the optimal set of surviving nodes engaged for recovering lost data includes: incrementally engaging the parity nodes according to their order of accessing cost; after each new engagement, calculating a total cost of accessing and repair bandwidth, where accessing cost increases by engaging more nodes, and where repair bandwidth cost decreases until the minimum total cost is reached.

The method further includes the step of searching to find a code with the lowest repair bandwidth when different parity nodes are involved in a single failure recovery.

The step of searching to find a code with the lowest repair bandwidth when different parity nodes are involved in a single failure recovery includes for any systematic node failure and any participating set of surviving nodes, constructing a directed weighted graph in which the shortest path between the root and any leaf with all leaves are connected determines the minimum repair bandwidth.

The step of searching to find a code with the lowest repair bandwidth when different parity nodes are involved in a single failure recovery includes using only rotation codes and employing a search algorithm for single failure recovery while achieving low repair bandwidth by minimizing the repair bandwidth regardless of the values of the rotation codes' $\lambda_{ij}$'s as long as they are non-zero.

The method further includes the step of reducing the search space of codes by using only rotation codes, where an (n,k) rotation code with length L is defined as follows, where $a_i$, i=1, . . . , k as the k systematic node vectors, where n–k parity node vectors are defined as k $$p_j = {}^{\Sigma}\lambda_{ij} a_i R_{ij}, j=1, \ldots, n-k \quad (1)$$

I=1 where the coefficients $\lambda_{ij}$ are chosen to ensure an MDS property and $R_{ij}$ is a rotation matrix defined below, where $I_L=[e_1; e_2; \ldots; e_L]$ is the L×L identity matrix, where $e_I$ is a row vector of length L with 1 in the position I and 0 in every other positions, and where $R_I=[e_{I+1}; e_{I+2}; \ldots; e_L; \ldots; e_I]$ by cyclically rotating $I_L$'s rows/times, and then, $R_{ij}=R_I$ for some I, for a given set of rotation matrices $R_{ij}$, choosing $\lambda_{ij}$ parameters to make the code an MDS code by writing the MDS constraint equations and solving them for one set of $\lambda_{ij}$ parameters, checking if the code provides a progressive engagement property by considering all possible single failure cases and all possible involved parity nodes and calculating the corresponding repair bandwidth, if the repair bandwidth values are a decreasing function of the number of surviving nodes, the code is acceptable.

The MDS code is reused when the number of participating nodes varies without having to change the entire code structure and the content of the nodes.

The method further includes using a permutation code modified to include a progressive engagement property.

The illustrated embodiments of the invention also include a distributed storage system comprising an encoder, a decoder, and a distributed database having a plurality of separate portions into which data is stored by the encoder and from which data is accessed by the decoder to recover at least one portion of the distributed database from a variable user-determined number of other portions of the distributed database with minimal cost by linearly combining at least two cost metrics to construct a total cost function and selecting an optimal set of surviving nodes that incurs a minimum total cost during data recovery.

The plurality of separate portions of the distributed database include a corresponding plurality of storage nodes.

The corresponding plurality of storage nodes comprise a plurality of storage nodes in the cloud.

The plurality of separate portions of the distributed database comprise at least one failed storage node and a plurality of surviving storage nodes and where the encoder and decoder use and are defined by a code determined by a total cost which includes a cost associated with accessing selected surviving storage nodes in the in terms of delay or the number of hops to reach the selected nodes and a repair bandwidth cost associated with the amount of data and traffic downloaded from the selected surviving storage nodes for regenerating lost data.

The encoder and decoder use and are defined by a code based on a selected optimal set of surviving nodes that incurs a minimum total cost during data recovery by minimizing the number of storage nodes engaged for recovery by using a polynomial-time solution to determine an optimal number of surviving storage nodes used for recovery of lost data.

The encoder and decoder use and are defined by a code determined from the solution the optimal number of participating surviving storage nodes for recovering lost data by using an MDS code which has a progressive engagement property defined as: 1) providing flexibility in engaging any number of surviving nodes, without redesigning the code structure and changing the content of other nodes; and 2) reducing repair bandwidth by engaging more surviving nodes.

The encoder and decoder use and are defined by a code determined from the solution the optimal number of participating surviving storage nodes for recovering lost data by determining a solution of an integer equation $$\min_{\alpha_1,\ldots,\alpha_m} \omega_1 \sum_{i=1}^{m} \alpha_i c_{1i} + \omega_2 \gamma\left(\sum_{i=1}^{m} \alpha_i\right)$$

s.t. I) $\sum_{i=1}^{m} \alpha_i \geq 1$

II) $\alpha_i \in \{0, 1\}, \quad i = 1, \ldots, m,$ by finding p* nodes from the parity set of P-nodes, 1 . . . m that minimize a weighted sum of the repair bandwidth and the accessing cost, defining a binary indicator $\alpha_j$ included in the set $\{0, 1\}$, for every i=1, . . . , m such that $c_j$ is 1 if P-node i is selected, and 0 otherwise, where accessing cost is represented by the cost matrix $C=\{c_{ij}\}_{n\times n}$, where $c_{ij}$ denotes the cost associated with contacting and accessing node j for recovering the data of node i, where repair bandwidth cost is denoted by γ(p) for a given coding scheme, and where $\omega_1$, and $\omega_2$ are the respective weights to accessing cost and repair bandwidth costs normalized to $\omega_1+\omega_2=1$.

The encoder and decoder use and are defined by a code with a minimal repair bandwidth when different parity nodes are involved in a single failure recovery, which code is found by using only rotation codes, by checking if the code has a progressive engagement property, by considering all possible single failure cases and all possibly involved parity nodes, and by calculating the corresponding repair bandwidth to determine if the repair bandwidth is a decreasing function of the number of surviving nodes.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

The general objective of minimizing the total accessing cost takes the existing objectives of minimizing repair bandwidth, delay or the number of hops as its special cases. For instance, it reduces to minimizing the number of nodes to be engaged for the recovery process, if the repair bandwidth is ignored, and the accessing cost is assumed to be the same for all nodes. We formulate an optimization problem and provide a polynomial-time solution for the general objective that essentially determines the optimal number of participating nodes and the optimal set of nodes to be engaged for recovering the lost data. Applying our solution to a dynamic cloud system where the accessing cost or even the number of available nodes are subject to change results in different values for the optimal number of participating nodes. For the practical purposes, we disclose a design for an MDS code that can be reused when the number of participating nodes varies without having to change the entire code structure and the content of the nodes. This requirement calls for a new class of MDS codes with a new property that we call progressive engagement. This property provides flexibility in engaging more surviving nodes in favor of reducing the repair bandwidth without redesigning the code structure.

The existing MDS codes fail to satisfy this pivotal property. In traditional MDS codes such as Reed-Solomon codes, engaging more nodes does not lead to the reduction of repair bandwidth. On the other hand, progressive engagement is not satisfied in the existing MDS codes designed fog reducing repair bandwidth, since their structure varies with the number of participating nodes. This fact renders them nonpractical for many systems with unknown number of participating nodes in advance.

A similar approach to the progressive engagement can be seen in adaptive rate punctured codes for communication systems. Such codes allow the transmission of information with different levels of protection, at various rates without redesigning the code. Progressive engagement property has another implication that allows for adding new storage nodes to the system without changing the contents of the existing nodes. We further introduce an MDS code holding engagement property based on the permutation code.

Below we describe the system model and formulate the problem of optimal node selection. A selection scheme called progressive engagement is explained and one example of MDS codes that can support such scheme is described. Some numerical results are provided.

In the illustrated embodiments of the invention, an MDS code that has a progressive engagement property is one that: 1) provides flexibility in engaging any number of surviving nodes, without redesigning the code structure and changing the content of other nodes; and 2) requires less or reducing repair bandwidth by engaging more surviving nodes. In the case where repair bandwidth is optimized, for any value of participating nodes d such a code requires a minimum repair bandwidth as if it were designed for that particular d. However, even if that minimum bandwidth is not achieved for all d, the MDS codes with progressive engagement property are still practically more appealing over the codes that only work for a fixed d. The advantage of the MDS codes with the progressive engagement property over the traditional MDS codes such as Reed Solomon codes is the capability to reduce repair bandwidth by involving more participating nodes or another selected parameter. In fact, traditional MDS codes fail to satisfy the second condition of the above definition, while the recently proposed prior art codes that yield minimum repair bandwidth fail to meet the first condition of the definition.

For some of these prior art codes the number of participating nodes must be known when designing the codes. As d may not be known a priori, it is a great advantage of the MDS codes with the progressive engagement properly that they can be used when this number varies without changing the code structure or the content of the nodes. A similar requirement and restriction can be also seen in punctured error correcting codes. Punctured codes allow one to transmit information at various rates without redesigning the code while the code is as efficient as if it was designed for the respective rate.

The progressive engagement property has another implication that allows for adding new storage nodes to the system without changing the contents of the existing nodes. We further introduce a search algorithm to find a new class of codes that we call rotation codes providing the progressive engagement property. Moreover, we illustrate how the original repair scheme of the existing permutation code can be modified to accommodate such property.

Figure 1:
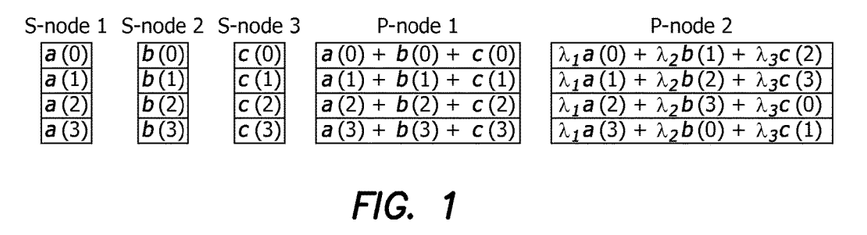
FIG. 1 is a diagram of a first code construction of the invention.

In what follows, we will provide an example of MDS codes with the progressive engagement property. Consider the following code structure depicted in the tables of FIG. 1 for n=5, k=3 and L=M/k=4. It can be shown that A1, A2, A3 exist to make this code MDS. The first parity node (P-node I) is the result of row XOR of the systematic nodes. For the second parity node (P-node 2), we first shift the rows of systematic nodes 2 and 3 (s-node 2 and S-node 3) by 1 and 2, respectively, in the binary domain and then XOR them. A similar code structure has been previously proposed with different shifting values. The repair bandwidth associated with this code for recovering S-node 1, S-node 2 and S-node 3 are respectively $\gamma_{s1}=9$, $\gamma_{s2}=8$ and $\gamma_{s3}=9$ when both parity nodes are engaged. For instance, if S-node I fails, by downloading     from S-node 2: rows {0, 1, 3}
    from S-node 3: rows {0, 1}
    form P-node 1: rows {0, 1}
    form P-node 2: rows {2, 3} we can recover the lost data. Note that the minimum possible repair bandwidth for the case of (n, k)=(5,3) is obtained as $$\gamma_{min} = \frac{d}{d-k+1}L = 8$$

where d is the total number of nodes participating in recovery. It is evident that all these values are less than the total data size M=12. Next, suppose we have a new parity node added to the system. We don't intend to change the existing coding structure in parity nodes, and simultaneously, we wish to reduce the repair bandwidth by engaging the new node for recovery.

Figure 2:
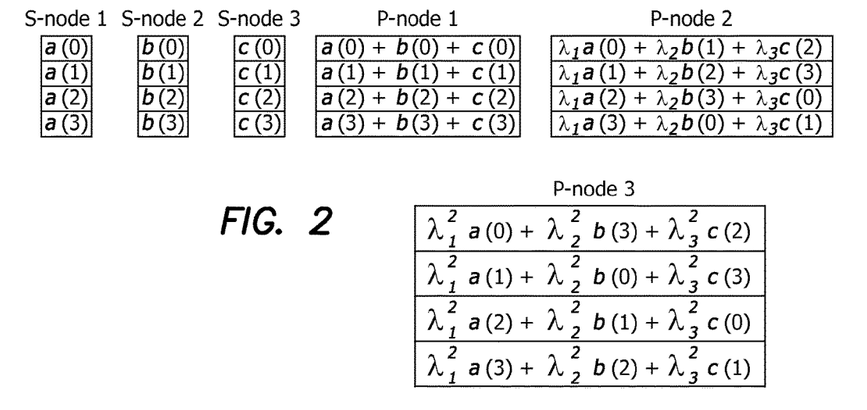
FIG. 2 is a diagram of a second code construction of the invention.

Consider the following code structure in FIG. 2. The new parity node is obtained by row XORing of S-node 1 and S-node 2 shifted by 3 and S-node 3 shifted by 2. We argue that this code has a progressive engagement property since, for example if S-node fails, we can recover the lost data by accessing the following rows,     from S-node 2: rows {0, 1}
    from S-node 3: rows {0, 1}
    from P-node 1: rows {0, 1}
    form P-node 2: rows {3}
    form P-node 3: rows {2}

This results in repair bandwidth $\gamma_{si}=8$ which is lower than that of previous case with only two parity nodes involved. We can observe that for other systematic node failures, we achieve the same repair bandwidth, i.e., $\gamma_{s2}=7$, $\gamma_{s3}=8$. It is important to note that although the previously proposed prior art codes achieve minimum repair bandwidth which is $$\gamma_{min} = \frac{d}{d-k+1}L = 6.6,$$

their code would be completely different compared to the case with only two parities ($(n, k)=(5, 3)$) and also the length of the code cannot be L=4 anymore. Hence, in that sense, our code can provide great flexibility.

In the example above, we provided a new coding structure. The other approach is to examine the existing MDS codes that reduce the repair bandwidth and modify their recovering scheme so as to support the progressive engagement property. An example of such codes is a permutational code. This code with its original recovering scheme cannot meet the progressive engagement property in definition. We show below how to change the recovering scheme for this example to make it provide the progressive engagement property.

We focus on an exact repair that copes better with practical storage systems. The minimum amount of data needed to be downloaded for recovering the lost data is called repair bandwidth. Prior work in this area strives to address the following question: What is the minimum repair bandwidth when only d surviving nodes are used for recovering single node failures in a (n, k) storage system? For the functional repairs, this question was answered by others who drew a connection between this problem and multi-casting problem where they modeled a storage system with a graph called information flow graph. Employing a min-cut theorem, they determined the minimum number of information bits that must be downloaded from each d nodes. The total repair bandwidth, denoted by $$\gamma_{min}(d) = \frac{Md}{k(d-k+1)}$$

in this case is given by $k(d-k+1)$. It is evident that when all nodes are engaged in the recovery process, i.e., $d=n-1$, the minimum possible repair bandwidth is achieved. For some particular cases of exact repair such as a) k=2 and k=n-1 when $c_j=n-1$ or b) $k/n<\frac{1}{2}$ and $d \leq 2k-1$, it has been shown respectively that the minimum repair bandwidth is achievable and they propose some methods to construct the MDS codes attaining the bound. All these designs were a function of d. Since the exact repair is a subset of the functional repair, the total repair bandwidth expressed above is a lower bound for the exact repair case. Later on, for a single disk failure and $d=n-1$, a practical MDS code has been proposed based on the permutational matrix that achieved the lower bound, where all surviving nodes contributed $1/(n-k)$ units of their stored information for repairing the failed node. Their assumption that all nodes participate for recovery process can be too costly for many systems. None of the MDS codes above provide flexibility in choosing the number of participating nodes without changing the code structure and the content of the nodes.

Figure 3:
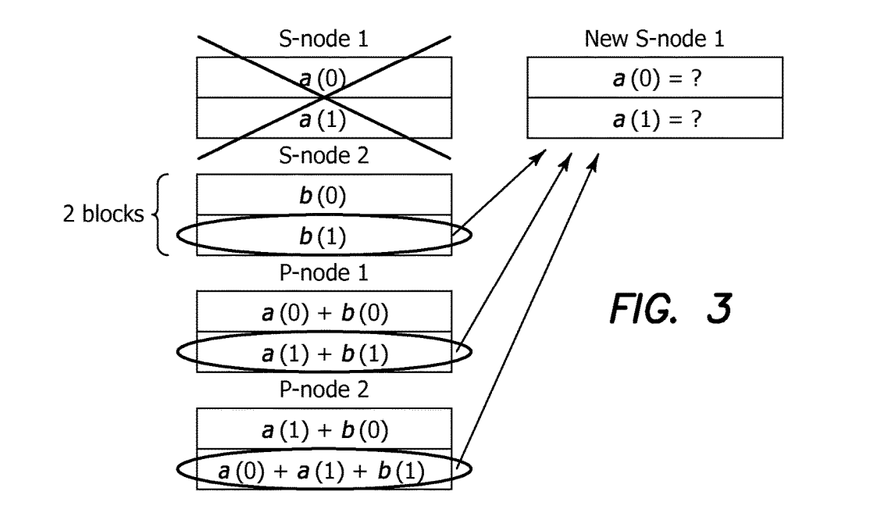
FIG. 3 is a diagram of the exact repair for n=4, k=2 system with M=4 blocks.

We consider a storage system consisting of an array of total n disks or nodes, among which k systematic nodes and n−k=m parity nodes. Systematic nodes hold the original data. Suppose a file of size M is evenly partitioned into k parts, each of size L=M/k blocks, and stored in the k systematic nodes. Each block also consists of fixed number of w-bit symbols. The content of parity nodes calculated from the original data using an erasure encoder. We assume an erasure code (n, k) with MDS property meaning that any k nodes suffice to recover the original data. This also means that up to (n−k) node failures can be tolerated without data loss. An example of such system with k=2 systematic nodes S-node 1 and S-node 2, m=2 parity nodes P-node 1 and P-node 2, and L=2 blocks is depicted in FIG. 3. The coding operation is conducted over the Galois Field $2^W$, where $n < 2^W - 1$. The common values for W are 8, 16, 32 depending on the size of the network.

To maintain the data integrity, when a node fails, the lost data must be recovered and saved into a new node. For a better exposition of this feature, assume the first node fails in a system with n=4 and k=2. Using a traditional MDS code, the new node could contact any two nodes and download four blocks of data, from which, a(0) and a(1) can be obtained. However, with the coding scheme shown in FIG. 3, it is also possible to download only three blocks b(1); a(1) b(1); a(0) a(1) b(1), from the three surviving nodes, and attain a(0) and a(1) via solving a linear equation. In this case, the repair bandwidth, defined as the minimum amount of data that must be downloaded to recover the lost data, is 3 blocks as opposed to 4 for the traditional MDS code. Let d denote the number of surviving nodes participating in the recovery process. While the former coding scheme needs d=2, the latter requires d=3.

It turns out that the minimum repair bandwidth is achieved when all the surviving nodes are engaged in the process of exact regeneration of the lost data. However, it may not be desirable to engage all the nodes in a cloud system with a large number of geographically distributed nodes. It is of our interest to engage an optimal set of available nodes for the recovery process considering their distances, link throughput as well as the total repair bandwidth. Subsequently, we consider two specific cost metrics for an optimal selection strategy; the accessing cost and the repair bandwidth cost. The accessing cost is represented by the cost matrix $C=\{c_{ij}\}_{n \times n}$ where $c_{ij}$ denotes the cost associated with contacting and accessing node j for recovering the data of node i. The value of $c_{ij}$ can be a function of multiple factors including communication delay, the number of hops to reach node j and so on. The sum cost of all nodes of a set determine the total accessing cost of that set. The repair bandwidth cost is denoted by $\gamma(p)$ for a given coding scheme when p parity nodes are selected to reconstruct the lost data. Here, we assume that all k−1 remaining systematic nodes participate for recovering the lost data.

Our objective is then to find p* nodes from the parity set of P-nodes, 1 . . . m that minimize the weighted sum of the repair bandwidth and the accessing cost. To proceed, we define a binary indicator $\alpha_j$ included in the set $\{0, 1\}$, for every i=1, . . . , m such that $c_j$ is 1 if P-node i is selected, and 0 otherwise. Without loss of generality, assume that systematic node S-node 1 fails. This problem can be cast into the following integer programming problem $$\min_{\alpha_1,\ldots,\alpha_m} \omega_1 \sum_{i=1}^{m} \alpha_i c_{1i} + \omega_2 \gamma\left(\sum_{i=1}^{m} \alpha_i\right)$$

s.t. I) $\sum_{i=1}^{m} \alpha_i \geq 1$

II) $\alpha_i \in \{0, 1\}, \quad i = 1, \ldots, m,$ where the first and second terms above encompasses the accessing cost and repair bandwidth cost, respectively. $\omega_1$, and $\omega_2$ are the respective weights normalized to $\omega_1+\omega_2=1$. Condition I in the equation above requires at least one parity node to be selected in order to ensure the reconstruction of the lost data for any MDS code. At the first glance, the problem in the equation above may seem to be hard to solve. However, the solution becomes apparent by letting $$\Sigma_{i=1}^{m}\alpha_i=p$$

Given p, the optimization variables can be obtained from $$A(p) = \min_{\alpha_1,\ldots,\alpha_m} \omega_1 \sum_{i=1}^{m} \alpha_i c_{1i}$$

$$\text{s.t.} \quad I) \sum_{i=1}^{m} \alpha_i = p$$

$$II) \ \alpha_i \in \{0, 1\}, \ i = 1, \ldots, m$$

with the solution $$\alpha_i(p)^* = \begin{cases} 1, & \text{if } i \in \text{argmin}_p(c_1, \ldots, c_m) \\ 0, & \text{otherwise} \end{cases}.$$

Where arg $\min_p(c_1, \ldots, c_m)$ returns an index set of the first p smallest c1, ..., $c_m$. In order to avoid this computation for each p, we can just sort the accessing costs $c_1, \ldots, c_m$ once with complexity m log m using quicksort algorithm and just return the index of the first p elements. Note that the $w_2\gamma(p)$ was dropped from the equations above since, given p, it was a constant term. As p can take only integer values from 1 to m, the solution can be obtained by iterating over p=1, . . . , m and finding p that achieves minimum A(p)+ $w_2\gamma(p)$. The corresponding $\alpha_i(p^*)^*$ will determine whether parity node i is in the optimal selection set or not. The overall search complexity in this case is in the order of O(m+m log m).

The optimization procedure above leads us to a selection strategy that we call progressive engagement. This strategy incrementally engages the parity nodes according to their order of accessing cost. After each new engagement, it calculates the total cost of accessing and repair bandwidth. While the accessing cost increases by engaging more nodes, the repair bandwidth cost drops for the MDS codes of our interest (we will discuss what MDS codes have this property below). This strikes a tradeoff between the repair bandwidth cost and accessing cost. The progressive engagement procedure continues until the minimum total cost is reached. This procedure resembles the progressive transmission in communication systems, where the number of parity bits to be transmitted incrementally increases until the receiver is able to decode the information.

Consider now those MDS codes with the progressive engagement property. For a dynamic cloud storage system with varying accessing cost and requirements, our proposed algorithm reaches to different values for optimal p*, and correspondingly, different optimal selection set of parity nodes. It is of our object to design an MDS code that can be reused when the number of participating nodes varies without having to change the entire code structure and content of the existing nodes. We provide the following formal definition for such codes. Although the illustrated embodiment addresses cloud storage networks, and in particular, dynamic cloud storage networks, the invention includes within its scope all and any storage networks, system or device, and in particular any distributed database.

Definition 2: An MDS code has progressive engagement property if it: 1) provides flexibility in engaging any number of surviving parity nodes, p, without redesigning the code structure and changing the content of other node and 2) requires less repair bandwidth by engaging more surviving nodes. For any value of p, such a code requires as minimum repair bandwidth as if it was designed for that particular p. However, even if that minimum bandwidth is not achieved for all p, the MDS codes with progressive engagement property are still practically more appealing over the codes that only work for a fixed p.

Proposition 1: The prior art permutation code with the disclosed modified recovering scheme has progressive engagement property. Furthermore, the repair bandwidth cost for a given p is $$\gamma(p) = kL - \frac{L}{n-k}(p-1)(k-1),$$

Where $L=(n-k)^k$.

The modification on recovering scheme along with the proof of the above equation are provided in Appendix. It remains unknown whether $-\gamma(p)$ above is the optimal repair bandwidth for the codes that support progressive engagement. The lower bound for the exact repair with d=p+k-1 participants is obtained from the equations above as $$\gamma_{min}(p) = \frac{L(p+k-1)}{p}.$$

Figure 4:
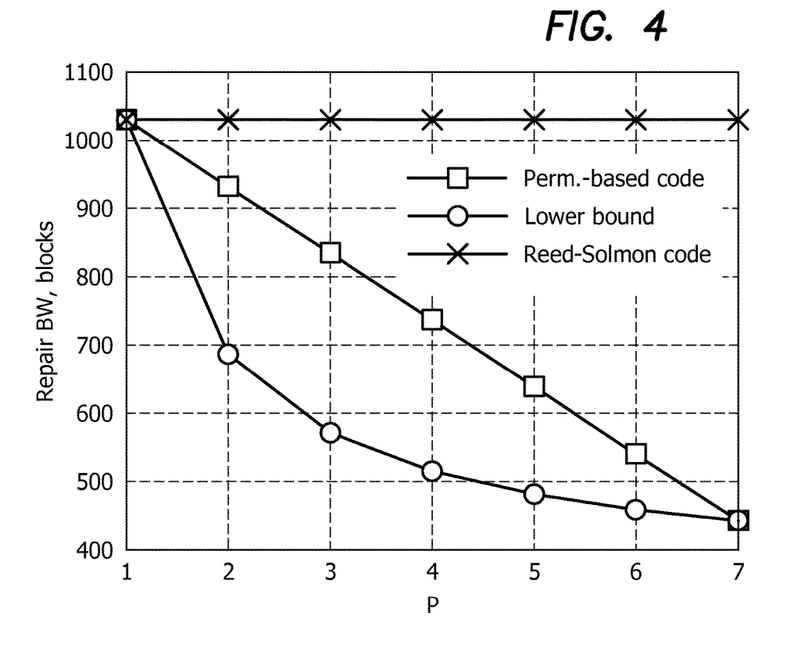
FIG. 4 is a graph of the repair bandwidth verses the number of parity nodes participating in recovery for the code based on permutation matrix with modified recovery scheme and Reed-Solomon code.

It would be insightful to compare the lower-bound immediately above and the repair bandwidth of the permutation code with our modified recovering scheme in the above equation. FIG. 4 provides such a repair bandwidth comparison and depicts the number of blocks verses the number of participating parity nodes p for (n, k)=(10, 3). For completeness of comparison, the repair bandwidth required by Reed-Solomon code is also included in FIG. 4. As we observe, the permutation code with our modified recovering scheme significantly outperforms the Reed-Solomon code in terms of repair bandwidth saving. Furthermore, this code satisfies the progressive engagement property as its associated repair bandwidth drops as p grows and does not need a new code structure and/or new node contents when p changes.

Figure 5:
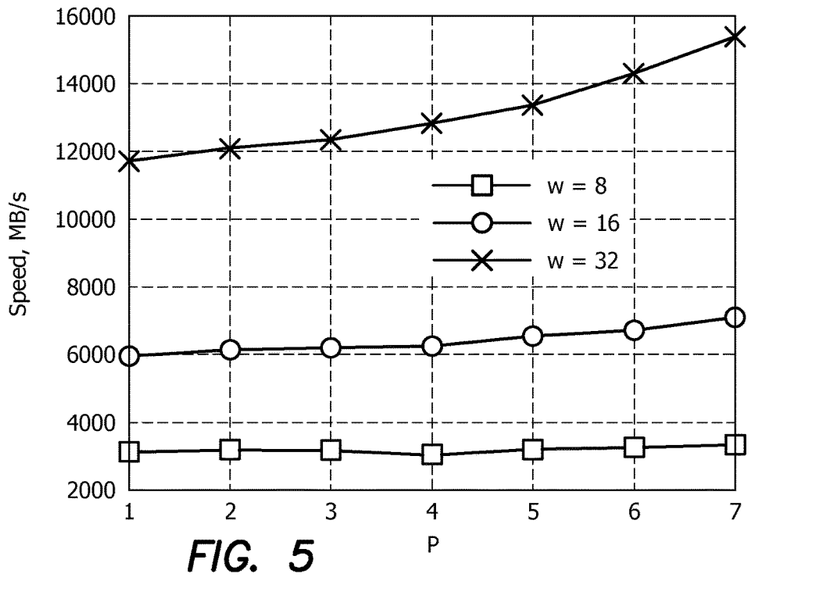
FIG. 5 is a graph of the CPU speed of single failure recovery verses the number of participating nodes for permutation code with (n, k) (10,3).

Consider now some numerical experiments to assess the performance of an MDS code with, progressive engagement property. In particular, we consider the (n, k)=(10, 3) permutation code with our modified recovering scheme. We implement this MDS code in C using the open source library for Galois Field arithmetic. All the details of recovering scheme discussed above are included in this implementation whose open source is available for download. Our first experiment evaluates the speed of recovering the data of a failed node verses the number of participating nodes for three symbol sizes w=8, 16, 32. We assume an M 32 MB file is distributed across n=10 storage nodes with m=7 parity nodes. This follows $L=m^3=343$ blocks of size roughly=32 KB. The speed here is defined as the amount of data recovered per second. On our Intel 1.8 HGz Intel core i5, we obtain the results shown in FIG. 5 using Monte Carlo simulation with 100 iterations. As we observe, the recovery speed increases as more parity nodes are engaged. Moreover, although arithmetic calculation in $GF(2^{32})$ is more time-consuming than $GF(2^8)$ and $GF(2^{16})$ the case corresponding to w=32 demonstrates highest speed. This is due to the fact that for a fixed block size, w=32 bits case has a lot less symbols to process compared to the other cases.

Figure 6:
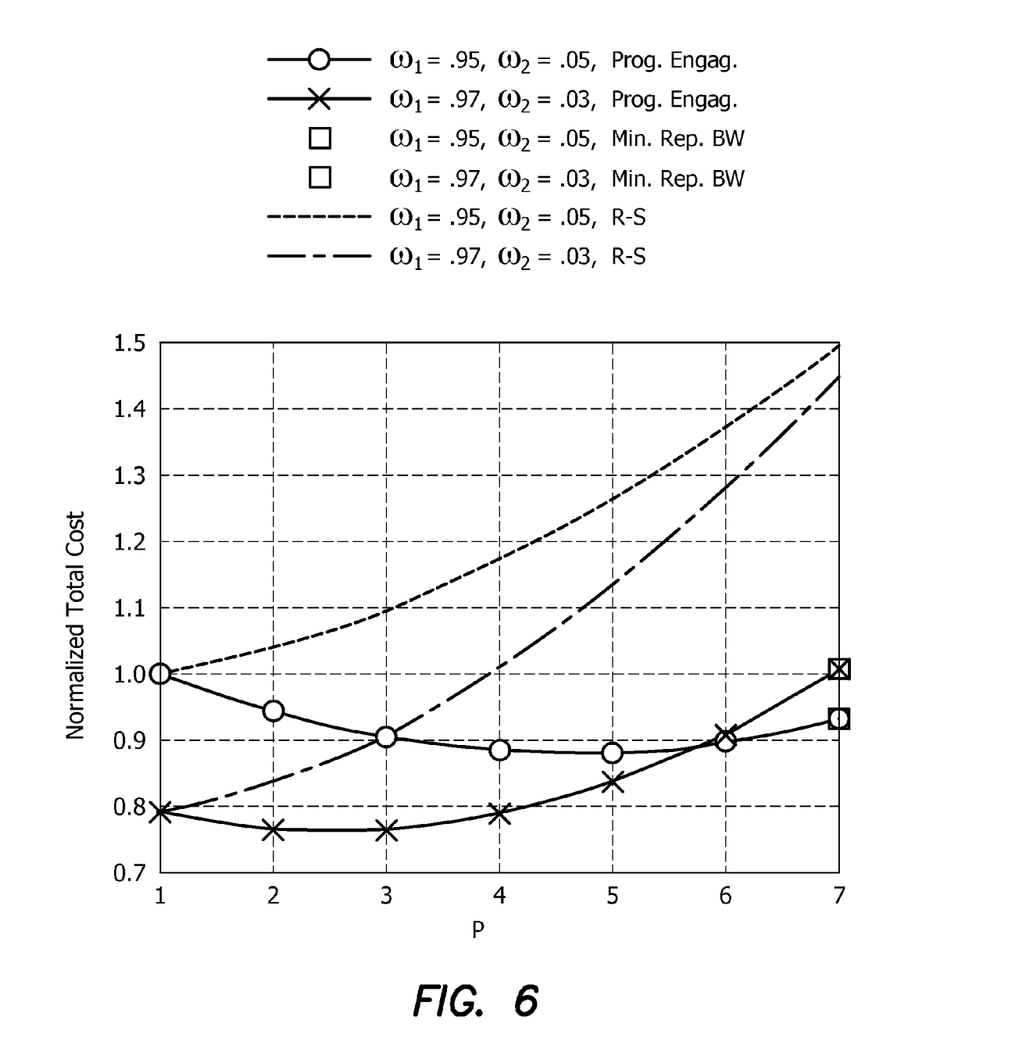
FIG. 6. Normalized total cost vs. the number of participating nodes where (n, k)=(10, 3) for various weights.

In the previous experiment, the accessing cost of parity nodes was ignored in favor of just showing the recovery speed of the code. In the next experiment, we include the accessing cost in terms of number of hops for a system whose 7 parity nodes are located from 1 to 7 hops away, i.e., $c_{1i}$=i. For such a system, FIG. 6 plots the total cost vs. the number of participating nodes for various coding schemes using two weights. The proposed solution above readily obtains the optimal p in our code with progressive engagement property (denoted by Prog. Engag). This optimal point clearly outperforms the Reed-Solomon code and the codes designed for minimizing the repair bandwidth in terms of achieving lower total cost. Moreover, unlike our code and Reed-Solomon code, the latter codes are just two points in this curve and have no values for p other than p=(n−k)=7.

Therefore, it can now be understood that we have disclosed a solution to the problem of selecting optimal surviving storage for recovering the data of a failed node. Two cost metrics, namely, accessing cost and repair bandwidth cost were jointly considered as the objective of our optimization. We further introduced a new class of MDS codes with a property called progressive engagement. This property provides flexibility in engaging more surviving nodes in favor of reducing the repair bandwidth without redesigning the code structure and content of the existing nodes.

Consider now progressive engagement in rotation codes. To accommodate the progressive engagement property in the permutation codes presented above, we kept the code structure (encoding) unchanged and modified the recovery scheme (decoding). Here we redesign the encoder for the goal of achieving lower repair bandwidth while providing flexibility in the number of engaging surviving nodes.

We propose a computer search to find a code with the lowest repair bandwidth when different parity nodes are involved in a single failure recovery. To make the computer search feasible, we reduce the search space by constraining the encoder to be a member of a family of codes that we call rotation codes. An (n,k) rotation code with length L is defined as follows. Let us define $a_i$, i=1, . . . , k as the k systematic node vectors. Then, the n−k parity node vectors are defined as $$p_j = \sum^{k} \lambda_{ij} a_i R_{ij}, \quad j = 1, \ldots, n-k \quad (1)$$

where the coefficients $\lambda_{ij}$ are chosen to ensure the MDS property and $R_{ij}$ is a rotation matrix defined below. Consider $I_L=[e_1; e_2; \ldots; e_L]$ as the L×L identity matrix, where $e_I$ is a row vector of length L with 1 in the position I and 0 in every other positions. Also, we define $R_I=[e_{I+1}; e_{I+2}; \ldots; e_L; \ldots; e_I]$ by cyclically rotating $I_L$'s rows I times. Then, $R_{ij}=R_I$ for some I.

To search for a good code, one can try all possible $R_{ij}$. Note that there are k(n−k) positions for $R_{ij}$ and the maximum complexity for a full search is $L^{k(n-k)}$ and finite. However, usually $R_{i1}=R_{1j}=I_L$, i=1, . . . , k, j=1, . . . , n−k and one can use other symmetrical properties to further reduce the search space. For a given set of rotation matrices $R_{ij}$, we choose $\lambda_{ij}$ parameters to make the code an MDS code. This can be done by writing the MDS constraint equations and solving them for one set of $\lambda_{ij}$ parameters. The solution is not unique, but any choice of $\lambda_{ij}$ parameters as long as the code is an MDS code is acceptable. The next step is to check if the code provides the progressive engagement property. To check the property, we consider all possible single failure cases and all possible involved parity nodes and calculate the corresponding repair bandwidth. If the repair bandwidth values are a decreasing function of the number of surviving nodes, i.e. involved parity nodes, the code is acceptable. In other words, for each code, we need to prove that in the case of single failure, the lost data can be reconstructed using any number of parity nodes. Since the above rotation code is an XOR-based code, we can employ a conventional algorithm for single failure recovery while achieving low repair bandwidth. This algorithm aims to minimize the repair bandwidth regardless of $\lambda_j$'s as long as they are non-zero. More specifically, for any systematic node failure and any participating set of surviving nodes, this algorithm constructs a directed weighted graph in which the shortest path between the root and any leaf (all leaves are connected) would determine the minimum.

TABLE III

Rotation code construction for (n, k) = (6, 3) and L = 3 with progressive engagement property repair bandwidth.

| S-node 1 | S-node 2 | S-node 3 | P-node 1 | P-node 2 | P-node 3 |
|---|---|---|---|---|---|
| a(0) | b(0) | c(0) | a(0)+ b(0)+ c(0) | a(0) + 2 b(1) + 3 c(3) | a(0) + 2 $^2$b(2) + 3 $^2$c(1) |
| a(1) | b(1) | c(1) | a(1)+ b(1)+ c(1) | a(1) + 2 b(2) + 3 c(0) | a(1) + 2 $^2$b(3) + 3 $^2$c(2) |
| a(2) | b(2) | c(2) | a(2)+ b(2)+ c(2) | a(2) + 2 b(3) + 3 c(2) | a(2) + 2 $^2$b(0) + 3 $^2$c(3) |
| a(3) | b(3) | c(3) | a(3)+ b(3)+ c(3) | a(3) + 2 b(0) + 3 c(3) | a(3) + 2 $^2$b(1) + 3 $^2$c(0) |

The height of this tree is equal to the number of blocks in the failed node. Using this algorithm, one can verify if both conditions of the progressive engagement property are satisfied for each choice of the code in equation (1). Note that the repair bandwidth resulted from this algorithm may not be the minimum but it is usually close to the minimum. To describe the details, we concentrate on an example for (n,k)=(6,3) and L=4 below. Let us consider the following (n,k)=(6,3) rotation code with L=4 as a candidate:

$$p_1 = a+b+cp_2 = a+\lambda_1 R_1 b + \lambda_2 R_3 c$$

$$p_3 = a + \lambda_1^2 R_2 b + \lambda_2^3 R_1 c \quad (2)$$

where $R_1=[e_2; e_3; e_4; e_1]$, $R_2=[e_3; e_4; e_1; e_2]$ and $R_3=[e_4; e_1; e_2; e_3]$ are the rotation matrices with $e_i$ being a row vector of length 4 with 1 in the position i and 0 in every other positions. The coefficients $\lambda_1$ and $\lambda_2$ in (2) are chosen to ensure the MDS property. The resulting structure is depicted in Table III above. Next, we show that the code in Table III provides the progressive engagement property. As explained before, sue use a conventional algorithm to recover the single failure with minimum repair bandwidth. The result of this algorithm is presented in Table IV below when S-node 1 fails and for all the sets of participating parity nodes.

As can be seen in Table IV, there are two sets with the same number of participating nodes that yield different repair bandwidths. Taking average over all failure and participating set cases,

TABLE IV

Decoding strategy for a (n, k) = (6, 3) code with L = 4 when node S-1 fails.

| Accessible parity set | Optimal parity blocks downloaded | Repair bandwidth |
|---|---|---|
| P-node1 or P-node2 or P-node3 | all blocks in the selected parity node | $\gamma(p = 1) = 12$ |
| (P-node1, P-node2) | $p_2(3), p_2(1), p_1(2), p_1(0), c(0), c(2), b(0), b(2)$ | $\gamma(p = 2) = 8$ |
| (P-node1, P-node3) | $p_3(3), p_3(2), p_1(0), p_1(1), c(0), c(1), c(3), b(0), b(1)$ | $\gamma(p = 2) = 9$ |
| (P-node2, P-node3) | $p_2(3), p_2(2), p_2(1), p_2(0), c(0), c(3), b(0), b(1), b(2)$ | $\gamma(p = 2) = 9$ |
| (P-node1, P-node2, P-node3) | $p_2(3), p_2(1), p_1(1), p_1(0), c(0), c(2), b(0), b(2)$ | $\gamma(p = 3) = 8$ | we have $$\gamma^-(p=1)=12, \gamma^-(p=2)=8.66, \gamma^-(p=3)=8$$

It is evident that the rotation code in equation (2) provides the progressive engagement property as the number of participating parity nodes increases, the repair bandwidth drops.

Figure 7:
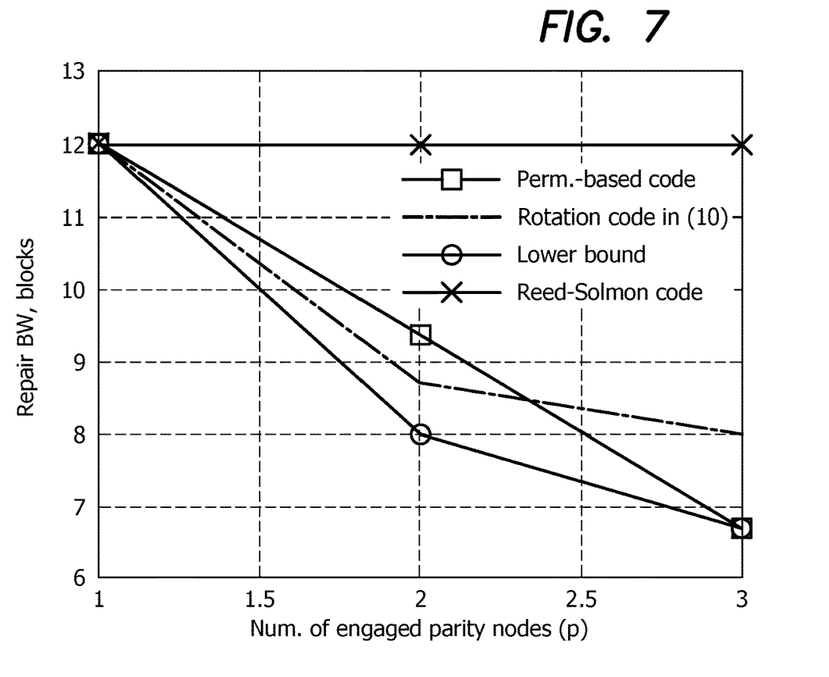
FIG. 7 is a graph of the repair bandwidth versus the number of parity nodes participating in recovery for the rotation code in equation (1) and permutation code with modified recovery scheme and Reed-Solomon code.

It would be insightful to compare the lower-bound (8) and the repair bandwidth of the rotation code and permutation code with our modified recovering scheme in (6). FIG. 7 provides such a repair bandwidth comparison and depicts the number of blocks versus the number of participating parity nodes p for (n,k)=(6,3). For completeness of comparison, the repair bandwidth required by Reed-Solomon code is also included in FIG. 7. Our proposed rotation code and the permutation code with our modified recovering scheme significantly outperform the Reed-Solomon code in terms of repair bandwidth saving.

Furthermore, both of these codes satisfy the progressive engagement property as their associated repair bandwidth drops as p grows and do not need a new code structure and/or new node contents when p changes We also observe that our proposed rotation code results in lower repair bandwidth compared to the permutation code with modified decoding when only two parity nodes are available for recovery. However, when all three parity nodes are involved, the permutation code requires the same bandwidth as the lower bound and lower than that of our proposed rotation code.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

For example, notwithstanding the fact that the elements of a claim are set forth below in a certain combination, it must be expressly understood that the embodiments include other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary shill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A distributed database network comprising a plurality of storage nodes, the distributed database network being configured to recover data for at least one of the plurality of storage nodes after it has failed, the distributed database network further comprising:
   a subset of surviving storage nodes from the plurality of storage nodes; and
   at least one new storage node to be added to the surviving subset of storage nodes,
   wherein the network is configured to incrementally engage the surviving subset of storage nodes according to an accessing cost associated with each of the nodes within the surviving subset of storage nodes with progressive engagement, wherein the network is configured to calculate a total cost of accessing and repairing bandwidth after each of the surviving subset of storage nodes has been engaged, and wherein the network is configured to download data from each of the engaged surviving subset of storage nodes and save the downloaded data in the at least one new storage node, wherein at least a portion of the downloaded data corresponds to the data lost for the at least one failed storage node.

2. The distributed database network of claim 1 wherein the network being configured to calculate a total cost of accessing and repair bandwidth after each of the surviving subset of storage nodes has been engaged comprises the network being configured to linearly combine at least a lowest repair bandwidth cost $\gamma(p)$ and an accessing cost $C=\{c_{ij}\}_{n \times n}$ to construct a total cost function.

3. The distributed database network of claim 2 wherein the network being configured to linearly combine at least a lowest repair bandwidth cost $\gamma(p)$ and an accessing cost $C=\{c_{ij}\}_{n \times n}$ to construct a total cost function comprises the network being configured to use only rotation codes and employ a search algorithm for single failure recovery while achieving low repair bandwidth by minimizing the repair bandwidth regardless of the values of the rotation codes' $\Delta_{ij}$'s as long as they are non-zero.

4. The distributed database network of claim 2 wherein the network being configured to linearly combine at least a lowest repair bandwidth cost $\gamma(p)$ and an accessing cost $C=\{c_{ij}\}_{n \times n}$ to construct a total cost function comprises the network being configured to determine a cost associated with accessing a selected plurality of the surviving subset of storage nodes in terms of delay or a number of hops to reach the selected plurality of the surviving subset of storage nodes, and determining a repair bandwidth cost associated with an amount of data and traffic downloaded from the selected plurality of surviving subset storage nodes for regenerating lost data.

5. The distributed database network of claim 2 wherein the network being configured to incrementally engage the surviving subset of storage nodes according to an accessing cost associated with each of the nodes within the surviving subset of storage nodes comprises the network being configured to engage a minimal number of surviving subset of storage nodes and determine an optimal number of surviving storage nodes needed for recovering the data of the at least one failed storage node.

6. The distributed database network of claim 2 wherein the network is further configured to determine the optimal number of surviving storage nodes needed for recovering the data of the at least one failed storage node by using a maximum distance separable (MDS) code that has a progressive engagement property defined as: 1) providing flexibility in engaging any number of the surviving subset of storage nodes without redesigning the code structure and changing the content of a remaining plurality of the surviving subset of storage nodes; and 2) reducing repair bandwidth by engaging more of the surviving subset of storage nodes in the network.

7. The distributed database network of claim 6 wherein the network being configured to determine the optimal number of participating surviving storage nodes in the network and the optimal set of surviving nodes needed for recovering the data of the at least one failed storage node comprises the network being configured to incrementally engage the subset of surviving storage nodes according to their order of accessing cost and, after each successive engagement, determine a total cost of accessing and repair bandwidth where accessing cost increases by engaging more of the surviving storage nodes and where repair bandwidth cost decreases until the minimum total cost is reached.

8. The distributed database network of claim 6 wherein the network is further configured to reuse the MDS code when the number of surviving subset of storage nodes varies without having to change the entire code structure and the content of the surviving subset of storage nodes.

9. The distributed database network of claim 6 wherein the network is configured to use a permutation code modified to include a progressive engagement property.

10. A distributed storage system comprising:
an encoder;
a decoder; and
a distributed database comprising a plurality of storage portions, wherein each storage portion is configured to store data received from the encoder and provide data to the decoder,
wherein the plurality of storage portions are configured to recover data lost of at least one of the plurality of storage portions of the distributed database with minimal cost by linearly combining at least two cost metrics to construct a total cost function and selecting an optimal set of surviving storage portions that incurs a minimum total cost during data recovery, wherein the at least two cost metrics comprise an accessing cost $C=\{c_{ij}\}_{n \times n}$ and a repair bandwidth cost $\gamma(p)$,
wherein the plurality of storage portions of the distributed database each comprise at least one failed storage node and a subset of surviving storage nodes, and
wherein the encoder and decoder are configured to use a code determined by a total cost which includes a cost associated with accessing a selected plurality of the subset of surviving storage nodes in terms of 1) delay or a number of hops to reach the selected plurality of the subset surviving storage nodes and 2) a repair bandwidth cost associated with an amount of data and traffic downloaded from the selected plurality of the subset surviving storage nodes for regenerating lost data.

11. The distributed storage system of claim 10 wherein the encoder and decoder are configured to use a code based on a selected optimal plurality of the subset of surviving storage nodes that incurs a minimum total cost during data recovery by minimizing the number of surviving storage nodes engaged for recovery by using a polynomial-time solution to determine an optimal number of surviving storage nodes for recovery of lost data.

12. The distributed storage system of claim 10 wherein the encoder and decoder are configured to use a code with a minimal repair bandwidth when different parity nodes are involved in a single failure recovery, which code is found by using only rotation codes, by checking if the code has a progressive engagement property, by considering all possible single failure cases and all possibly involved parity nodes, and by calculating the corresponding repair bandwidth to determine if the repair bandwidth is a decreasing function of the number of surviving storage nodes.

13. The distributed storage system of claim 10 wherein the encoder and decoder are configured to use a code determined from the solution of the optimal plurality of the subset of surviving storage nodes for recovering lost data by using a maximum distance separable (MDS) code which has a progressive engagement property defined as: 1) providing flexibility in engaging any number of surviving storage nodes without redesigning the code structure and changing the content of any other of the subset of surviving storage nodes; and 2) reducing repair bandwidth by engaging more of the subset of surviving storage nodes.

* * * * *